(12) United States Patent
Sczyrba et al.

(10) Patent No.: US 7,811,727 B2
(45) Date of Patent: Oct. 12, 2010

(54) METHOD FOR DETERMINING AN EXPOSURE DOSE AND EXPOSURE APPARATUS

(75) Inventors: Martin Sczyrba, Dresden (DE); Markus Waiblinger, Constance (DE); Axel Feicke, Augustusburg (DE); Karsten Bubke, Dresden (DE)

(73) Assignee: Advanced Mask Technology Center GmbH & Co. KG (DE)

( * ) Notice: Subject to any disclaimer, the term of this patent is extended or adjusted under 35 U.S.C. 154(b) by 977 days.

(21) Appl. No.: 11/601,227

(22) Filed: Nov. 17, 2006

(65) Prior Publication Data

US 2007/0117032 A1  May 24, 2007

(30) Foreign Application Priority Data

Nov. 18, 2005 (EP) ................... 05110971

(51) Int. Cl.
*G03F 9/00* (2006.01)
(52) U.S. Cl. ................. 430/30; 430/296; 430/942
(58) Field of Classification Search .................. 430/30, 430/296, 942
See application file for complete search history.

(56) References Cited

U.S. PATENT DOCUMENTS

| | | | |
|---|---|---|---|
| 5,808,892 A | 9/1998 | Tu | |
| 6,436,607 B1 | 8/2002 | Lozes et al. | |
| 6,475,684 B2 | 11/2002 | Ki | |
| 6,783,905 B2 * | 8/2004 | Yang | 430/30 |
| 2001/0016295 A1 | 8/2001 | Choi et al. | |
| 2003/0124442 A1 | 7/2003 | Yang | |

FOREIGN PATENT DOCUMENTS

| | | |
|---|---|---|
| JP | 59-208720 | 11/1984 |
| JP | 62-086718 | 4/1987 |
| JP | 02202015 | 8/1990 |

OTHER PUBLICATIONS

European Search Report EP 05 11 0971.
Japanese Office action for Japanese Patent App. No. 2006-312259 and English translation.

* cited by examiner

*Primary Examiner*—Christopher G Young
(74) *Attorney, Agent, or Firm*—Mayback & Hoffman, P.A.; Gregory L. Mayback; Rebecca A. Tie

(57) ABSTRACT

A method of determining an exposure dose for writing a pattern using an electron beam writer determines a target dose in the exposure region to obtain a predetermined energy deposition in a specific position of the exposure region, the predetermined energy deposition being larger than a reference energy deposition in the non-exposure region. The target dose is locally increased in a marginal region of the exposure region (the marginal region being adjacent the exposure boundary) to a value that obtains an energy deposition in the marginal region higher than the predetermined energy deposition. Optionally, the target dose can be locally decreased in an intermediate region of the exposure region (the intermediate region being adjacent the marginal region) to a value that obtains an energy deposition in the intermediate region smaller than the predetermined energy deposition. Also provided is an exposure device for carrying out the method.

20 Claims, 4 Drawing Sheets

METHOD FOR DETERMINING AN EXPOSURE DOSE AND EXPOSURE APPARATUS

CROSS-REFERENCE TO RELATED APPLICATIONS

This application claims the priority, under 35 U.S.C. §119, of European patent application No. 05 110 971.8, filed Nov. 18, 2005; the prior application is herewith incorporated by reference in its entirety.

BACKGROUND OF THE INVENTION

Field of the Invention

The present invention refers to a method of determining an exposure dose for writing a pattern using a beam writer as well as to an exposure apparatus. This method can, in particular, be used for optimizing the exposure parameters when writing a pattern using an electron beam writer. In particular, the pattern that is written using an electron beam writer can form part of a photomask.

During the manufacture of a semiconductor device, components of the device usually are formed by patterning layers that are deposited on a semiconductor wafer, in particular, a silicon wafer. The patterning of these layers usually is accomplished by applying a resist material onto the layer that has to be patterned and by subsequently exposing predetermined portions of the resist layer that is sensitive to the exposure wavelength. Thereafter, the regions that have been irradiated with the radiation (or not) are developed and the irradiated or radiated portions are subsequently removed. As a consequence, portions of the layer are masked by the generated photoresist pattern during a following process step, such as an etching step or an implantation step. After processing the exposed portions of the underlying layer, the resist mask is removed.

For patterning the resist layer, usually photolithographical masks (photomasks) or reticles are used for transferring a predetermined pattern onto the layer to be patterned. For example, a photomask, which can be used for optical lithography, includes a substrate made of a transparent material such as quartz glass, as well as a patterned layer that can be made of an opaque material, for example, a metal such as chromium. Alternatively, the patterned layer can be made of a phase-shifting semitransparent material such as molybdene silioxinitride (MoSiON). In other known photomasks, the quartz substrate itself is patterned to provide a phase-shifting mask. In addition, part of the quartz substrate can be covered with a pattern made of a phase shifting layer. The patterned material results in a modulation of the intensity of the transmitted light.

Usually, the pattern on such a photomask or reticle is formed by patterning a material layer that is deposited on the surface of a mask substrate. In particular, the corresponding pattern is written into a resist material that is sensitive to electron beam radiation. After a corresponding development step, the exposed or unexposed portions of the resist material are removed, whereby part of the material layer is no longer covered and can be etched by a suitable etch process. For example, when using a negative resist material due to the irradiation with an electron beam, the resist material becomes insoluble in a specific solvent. On the other hand, when using a positive resist material, due to the irradiation with an electron beam, the resist material becomes soluble in a specific solvent.

An "indirect writing" method refers to a method in which the resist material lying above the portions of the material layer that have to be removed is exposed to the electron beam radiation, whereas the resist material lying above the remaining portions of the material layer is not exposed.

Another application field of electron beam lithography refers to the writing of patterns on a silicon wafer, in particular, when defining application specific integrated circuits.

FIGS. 1A to 1D illustrate a generally known electron beam exposure method. On the surface 10 of a mask substrate, for example, a quartz substrate, a material layer 11 of a material that is to be patterned is deposited. For example, the material layer 11 can be made of an opaque material such as chrome or a semitransparent or a phase shifting material such as MoSiON. On the surface of the material layer 11, a positive resist material, which is sensitive to electron beam radiation, is applied. As is known, instead of the mask substrate 1, any other suitable substrate, in particular, a semiconductor wafer can be used. Likewise, the material layer 11 can be any arbitrary material layer that has to be patterned.

In a first step, electron beam radiation 2 is irradiated onto the predetermined portions of the surface of the resist material 12. The positions, at which the electron beam radiation is to be irradiated, as well as the energy and the dose, are controlled by the components of a corresponding electron beam writer.

As is shown in FIG. 1B, after the exposure step, a developing step is performed, in which the exposed portions of the resist material 12 are solved in a suitable solvent. As can be seen, the portion of the resist layer that has not been irradiated with electron beam radiation remains. Thereafter, as is shown in FIG. 1C, an etching step is performed so as to remove the exposed portions of the material layer 11. Thereafter, as can be seen from FIG. 1D, the remaining portions of the resist layer 12 are removed, leaving a pattern 13. As can be seen, the patterned portion 13 of the layer 11 remains at those portions that have not been irradiated with electron beam radiation in the exposure step. The pattern 13 has a line width CD ("critical dimension").

According to this indirect writing method, a pattern is formed by irradiating the portions at which the material layer is to be removed while the portions of the material layer, which are to remain, are not irradiated. In a likewise manner, instead of isolated lines, a lines/spaces pattern having a plurality of lines, optionally arrayed in a periodic manner, can be defined.

The resolution of electron beam lithography is limited by the scattering of electrons in the resist material. In particular, the scattering includes the forward scattering of electrons, typically having a small range as well as the back scattering of the electrons, which have been reflected by the surface of the silicon wafer or any other layer beneath the resist material, the back scattering typically having a larger range.

Accordingly, for example, areas that are not directly exposed suffer from an additional energy deposition that depends on the density of the layout.

Variations of the line width due to the long range scattering of electrons can be compensated for by reducing an exposure dose at those portions at which interfering radiation due to scattering of electrons having a long range is expected. This compensation is referred to as a proximity correction.

According to the proximity correction, the dose of the exposure is adjusted to the density of the layout, resulting in significantly different exposure doses for dense lines/spaces structures in comparison with isolated clear and dark structures. Thereby, a similar structure size independent from the density of the neighboring structures is achieved.

Due to the short range scattering of electrons, the line width of a pattern to be defined is further varied. In particular, the short range scattering of electrons causes less uniformity and poorer resolution of lines to be patterned. To be more specific, when defining the structure shown in FIG. 1D, the electrons defining the edges 23 are scattered, resulting in a deviation of structure size that is caused by local dose variations. Differently speaking, due to the short range scattering, depending on the desired structure size, the quality of the pattern is degraded.

U.S. Pat. No. 5,808,892 to Tu discloses an electron beam processing method wherein a corresponding one of a variety of recipes is selected for evaluating figure pattern fracturing and electron beam processing parameters based on the width of the figure pattern.

Moreover, U.S. Pat. No. 6,475,684 to Ki discloses a method of correcting line width variations due to a loading effect during etching of a photomask.

SUMMARY OF THE INVENTION

It is accordingly an object of the invention to provide a method for determining an exposure dose and an exposure apparatus that overcome the hereinafore-mentioned disadvantages of the heretofore-known devices and methods of this general type and that determines an exposure dose for writing a pattern whereby the influence of short range scattering of electrons can be alleviated and that provides writes a pattern having an improved quality.

With the foregoing and other objects in view, there is provided, in accordance with the invention, a method for determining an exposure dose for writing a pattern using a beam writer, in which the pattern is written dot-by-dot by exposing the corresponding dot to the beam having a predetermined energy. The method includes the steps of determining an exposure region and a non-exposure region, defining an exposure boundary between the exposure region and the non-exposure region, and defining a marginal region of the exposure region adjacent the exposure boundary, determining a target dose in the exposure region that obtains a predetermined energy deposition in a specific position of the exposure region, the predetermined energy deposition being larger than a reference energy deposition in the non-exposure region, and locally increasing the target dose in the marginal region to a value that obtains an energy deposition in the marginal region higher than the predetermined energy deposition.

With the objects of the invention in view, in a beam writing process where a pattern is written dot-by-dot by exposing a corresponding dot to a beam having a predetermined energy, there is also provided a method for determining an exposure dose for writing a pattern with the beam writer. The method includes the steps of determining an exposure region and a non-exposure region, defining an exposure boundary between the exposure region and the non-exposure region, and defining a marginal region of the exposure region adjacent the exposure boundary, determining a target dose in the exposure region that obtains a predetermined energy deposition in a specific position of the exposure region, the predetermined energy deposition being larger than a reference energy deposition in the non-exposure region, and locally increasing the target dose in the marginal region to a value that obtains an energy deposition in the marginal region higher than the predetermined energy deposition.

In particular, the present invention provides a method of determining an exposure dose for writing a pattern using a beam writer, in which the pattern is written dot-by-dot by exposing the corresponding dot to the beam having a predetermined energy, including the steps of determining an exposure region and a non-exposure region, an exposure boundary being defined between the exposure region and the non-exposure region, determining a target dose in the exposure region to obtain a predetermined energy deposition in a specific position of the exposure region, the predetermined energy deposition being larger than a reference energy deposition in the non-exposure region, and locally increasing the target dose in a marginal region of the exposure region, the marginal region being adjacent to the exposure boundary, to a value that obtains an energy deposition in the marginal region that is higher than the predetermined energy deposition.

The term "beam writer," as referred to herein, refers to any kind of exposing device in which a pattern is written dot-by-dot by single shots, the single shots exposing the corresponding dot to a predetermined amount of energy. In such a beam writer, the energy amount of every single pixel is determined dependent upon the position of the pixel by a fracturing schema. The beams can, for example, be composed of photons or particles, in particular, charged particles such as ions or electrons.

In particular, the width of the marginal region is less than or equal to 1 μm, the width being measured perpendicularly with respect to the exposure boundary. It is preferred that the width of the marginal region be less than 500 nm and, in particular, less than 250 nm. According to an especially preferred embodiment, the width of the marginal region is less than 200 nm, and even less than 150 nm. In particular, a width of the marginal region of less than 100 nm, in particular, less than 50 nm and, more specifically, 25 nm is preferred. The width of the marginal region can also be less than 20 nm, in particular, less than 15 nm or less than 10 nm and, more specifically, be less than 1 nm.

In this case, in the exposure region outside the marginal region, the exposure dose is set so that the predetermined energy deposition is achieved.

Preferably, the method further includes the step of locally decreasing the target dose in an intermediate region of the exposure region, to a value that obtains an energy deposition in the intermediate region that is smaller than the predetermined energy deposition. The intermediate region is adjacent the marginal region.

The intermediate region can have a width of less than or equal to 240 nm, the width being measured perpendicularly with respect to the exposure boundary. In particular, the width of the intermediate region can be less than 200 nm and, in particular, be less than 150 nm or even be less than 100 nm. It is especially preferred that the width of the intermediate region is less than 50 nm or even less than 25 nm and, in particular, less than 20 nm. According to an especially preferred embodiment, the width of the intermediate region is less than 15 nm, more preferred, less than 10 nm, and, in particular, less than 1 nm.

As the inventors of the present inventions have discovered, the gradient or slope of the function of the energy deposited in dependence upon the position at the boundary between exposure and non-exposure region mainly determines the deviation of the structure size due to local dose variations. Accordingly, by increasing the gradient or slope of this function, the uniformity of the structure size and the resolution limit can be improved. In other words, according to the method of the present invention, the exposure dose is adjusted so that the gradient of the function of energy deposition in dependence upon the position is increased at the exposure boundary.

As the inventors of the present invention have discovered, the gradient of the relationship between energy and position can be increased by locally increasing the target dose in a marginal region of the exposure region, wherein the marginal region is adjacent the edge of the pattern, thereby introducing a first assist feature. Nevertheless, by locally increasing the target dose, a problem may arise such that the critical dimension of the structure is different from the target critical dimension. Accordingly, optionally, in an intermediate region adjacent to the marginal region, the dose can be decreased to compensate for the higher energy deposition in the unexposed area that is caused by the first assist feature. In particular, the dose of these two features as well as the widths thereof can be adjusted to achieve the desired resolution limit, target structure size, structure size uniformity, and linearity of the feature.

Differently speaking, the present invention proposes the application of a first assist feature that is disposed next to the margin of the exposure region wherein the dose is increased. The first assist feature results in an improved energy contrast and, thus, an improved resolution and uniformity of the lines patterned. Optionally, a second assist feature is proposed, in which the dose is decreased with respect to the target dose in the remaining part of the exposure region, the second assist feature being disposed in an intermediate region adjacent to the marginal region. The second assist feature results in a correct targeting of the structure size.

The amount of increase of the target dose in the marginal region is limited by the fact that the energy deposited in the non-exposure region should not be too large. On the other hand, the amount of decrease of the target dose in the intermediate region is limited by the fact that the energy deposited in the intermediate region must be high enough to completely expose the resist material.

In particular, the following relation holds:

$$E_c \leq E_i < E_0,$$

wherein $E_i$ denotes the energy deposition in the intermediate region, $E_c$ denotes the dose to clear that is necessary to completely develop the resist material exposed by the beam, and $E_0$ denotes the predetermined energy deposition in those parts of exposure region that lie outside the marginal region and the intermediate region. For example, $E_i$ may be larger than or equal to $0.5 \times E_0$. By way of example, $E_i$ may be smaller than $0.7 \times E_0$.

To be more specific, the dose to clear corresponds to the minimum energy that is necessary to completely develop the resist material. As is generally known, the dose to clear is dependent upon the particular resist material used.

In accordance with another mode of the invention, an energy deposition is set according to the relation:

$$E_0 < E_m \leq 10 \times E_0,$$

where $E_m$ is the energy deposition in the marginal region and $E_0$ is the predetermined energy deposition in those parts of exposure region lying outside the marginal region and the intermediate region. According to an embodiment of the invention, $E_m$ may be smaller than $5 \times E_0$ and, for example, smaller than $2 \times E_0$. By way of further example, $E_m$ may be smaller than $1.6 \times E_0$.

With the objects of the invention in view, there is also provided an exposure apparatus for defining a pattern in a resist material on a substrate, includes a dot-by-dot beam generation unit generating a beam to define the pattern in the resist material on the substrate dot-by-dot by exposing a corresponding dot to a predetermined energy of the beam, the resist material having an exposure region, a non-exposure region, and an exposure boundary between the exposure region and the non-exposure region, the exposure region having a marginal region adjacent the exposure boundary, a dosage control unit connected to the beam generation unit for controlling a dose of the beam to which the substrate is exposed, a deflecting unit associated with the beam for deflecting the beam, a substrate holder for holding the substrate, a beam control unit connected to the beam generation unit for controlling generation of the beam, a deflection control unit connected to the deflection unit for controlling deflection of the beam by the deflecting unit, a computer sending data for determining an exposure dose dependent upon a position, an interface control unit connected to the computer and to the dosage control unit, the interface control unit controlling the dosage control unit corresponding to the data received from the computer, the data determining the exposure dose dependent upon the position, the exposure dose including a reference energy deposition in the non-exposure region and a target dose obtaining a predetermined energy deposition in a given position of the exposure region, the predetermined energy deposition being larger than the reference energy deposition, the interface control unit locally increasing the target dose in the marginal region to a value that obtains an energy deposition in the marginal region higher than the predetermined energy deposition.

In accordance with a further feature of the invention, the exposure region has an intermediate region adjacent the marginal region and the interface control unit locally decreases the target dose in the intermediate region to a value that obtains an energy deposition in the intermediate region smaller than the predetermined energy deposition.

In accordance with an added feature of the invention, the energy deposition in the intermediate region is defined according to the formula:

$$E_c \leq E_i < E_0,$$

where $E_i$ is the energy deposition in the intermediate region, $E_c$ is a dose to clear that is necessary to completely develop the resist material exposed by the beam, and $E_0$ is the predetermined energy deposition in parts of the exposure region lying outside the marginal region and the intermediate region. For example, $E_i$ may be larger than or equal to $0.5 \times E_0$. By way of example, $E_i$ may be smaller than $0.7 \times E_0$.

In accordance with a concomitant feature of the invention, the interface control unit locally increases the target dose according to the formula:

$$E_0 < E_m \leq 10 \times E_0,$$

where $E_m$ is the energy deposition in the marginal region and $E_0$ is the predetermined energy deposition in parts of the exposure region lying outside the marginal region and the intermediate region. According to an embodiment of the invention $E_m$ may be smaller than $5 \times E_0$ and, for example, smaller than $2 \times E_0$. By way of further example, $E_m$ may be smaller than $1.6 \times E_0$.

Accordingly, the present invention provides a method, whereby the resist resolution and, consequently, the linearity and resolution, can be remarkably improved. Accordingly, the photomasks that are manufactured by a method incorporating the method of the present invention have a better quality and yield. Additionally, the current resist materials can be applied to a wider range of applications.

Other features that are considered as characteristic for the invention are set forth in the appended claims.

Although the invention is illustrated and described herein as embodied in a method for determining an exposure dose and an exposure apparatus, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

In the following, the invention will be described in more detail by exemplary embodiments and the corresponding figures. By schematic illustrations that are not true to scale, the figures show different exemplary embodiments of the invention.

DESCRIPTION OF THE PREFERRED EMBODIMENTS

Although in the following description, an electron beam writer and, in particular, a method of determining an exposure dose in an electron beam writer is described, it is clearly to be understood that the present invention can, as well, be applied to other types of beam writers in which a pattern is written dot-by-dot by exposing the corresponding dot to the beam having a predetermined energy.

Referring now to the figures of the drawings in detail and first, particularly to FIG. 2A thereof, there is shown a typical energy profile used when writing a pattern in a method as is illustrated with reference to FIGS. 1A to 1D. In particular, plot "a" illustrates a conventional function of energy dependent upon x-coordinate, i.e., the energy that is deposited in a specific position. Usually, the portions in an exposure range are irradiated with a predetermined target dose, whereas around position 0 the dose is lowered to 0. Due to the scattering of electrons, the energy deposited in the non-exposure region 22 is higher than 0. An exposure dose that is determined by the method of the present invention is illustrated in plot "b". As can be seen, around position 0, the energy has a minimum value. However, at the edge of the exposure range, in the marginal region 24, the energy deposited is higher than in the remaining portions of the exposure region. Accordingly, when starting from position 0, the energy is increased to a maximum value and, thereafter, is decreased to a reference value. As a consequence, the gradient of the function of the energy in dependence upon the position is increased, resulting in an improved contrast.

Figure 1A:
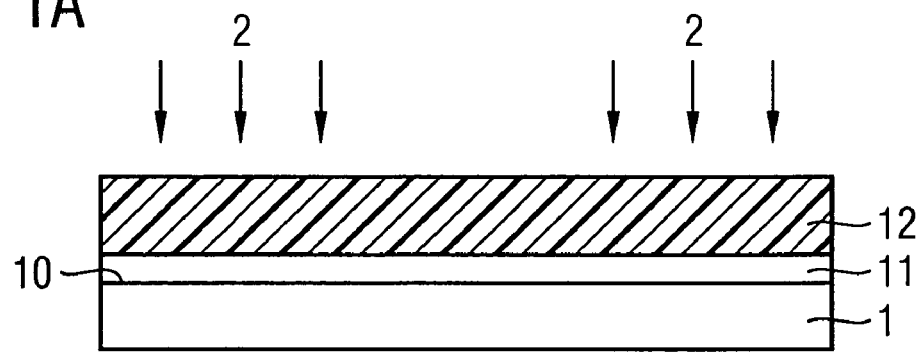
FIGS. 1A to 1D are fragmentary, cross-sectional views of different steps of a prior art electron beam exposure method, to which the method of the present invention can be applied.
Figure 1B:
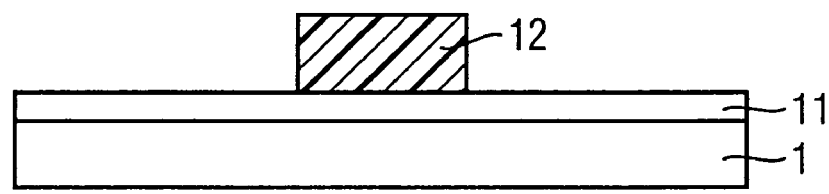
Figure 1C:
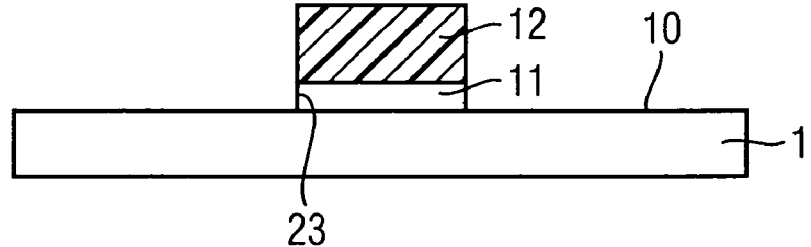
Figure 1D:
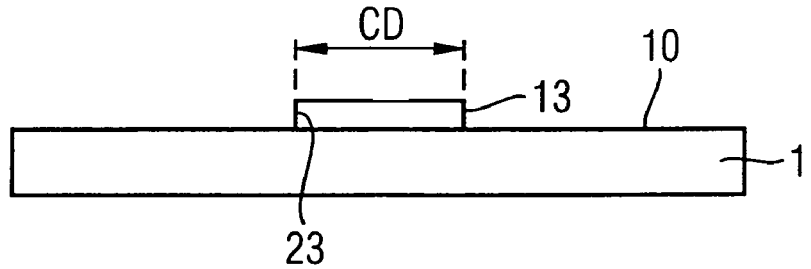
Figure 2A:
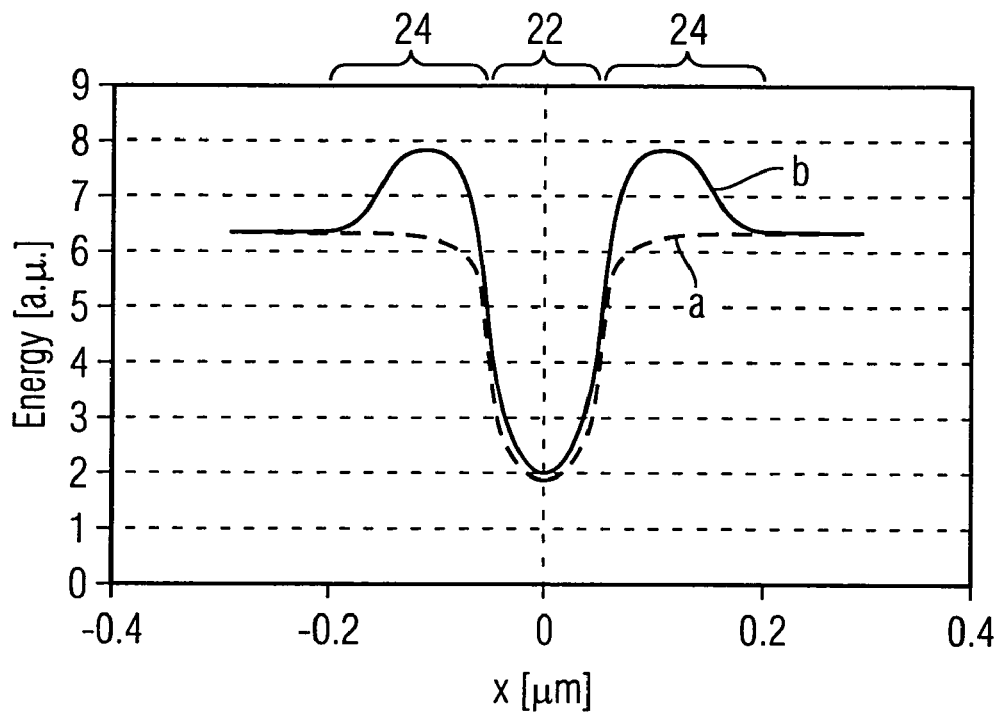
FIG. 2A is a graph of energy distributions of electrons for performing an electron beam exposure method according to an embodiment of the present invention.
Figure 2B:
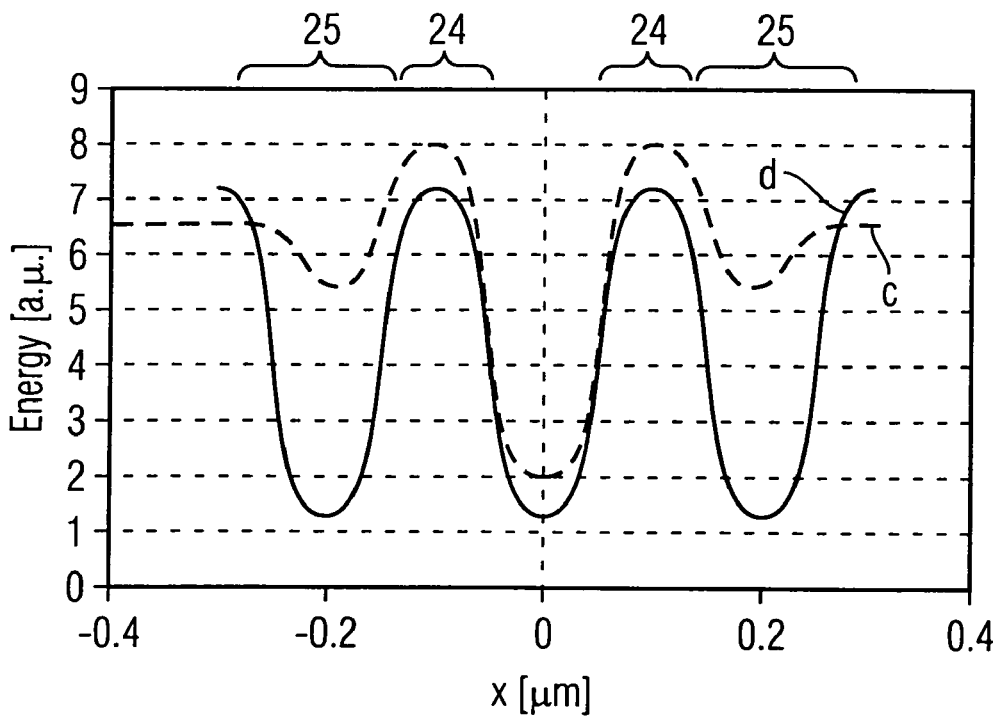
FIG. 2B is a graph of energy distributions of electrons for performing an electron beam exposure method according to another embodiment of the present invention.

FIG. 2B shows in plot "c" an energy distribution according to a second embodiment of the present invention. As can be seen, starting from position 0, the energy is increased to value 8 and thereafter, the energy is decreased to a local minimum value and thereafter, the energy is increased to a target dose of the exposure region. To be more specific, the exposure region includes a marginal region 24, in which the energy deposited is increased with respect to the target energy, and an intermediate region 25 adjacent to the marginal region 24, in which the energy deposited is decreased with a respect to the target energy.

Moreover, plot "d" illustrates a conventional function of energy vs. distance for a usual lines/spaces pattern.

For realizing the energy-position-function as depicted in FIGS. 2A and 2B, the exposure dose of every single pixel has to be adjusted in a suitable manner.

Figure 3:
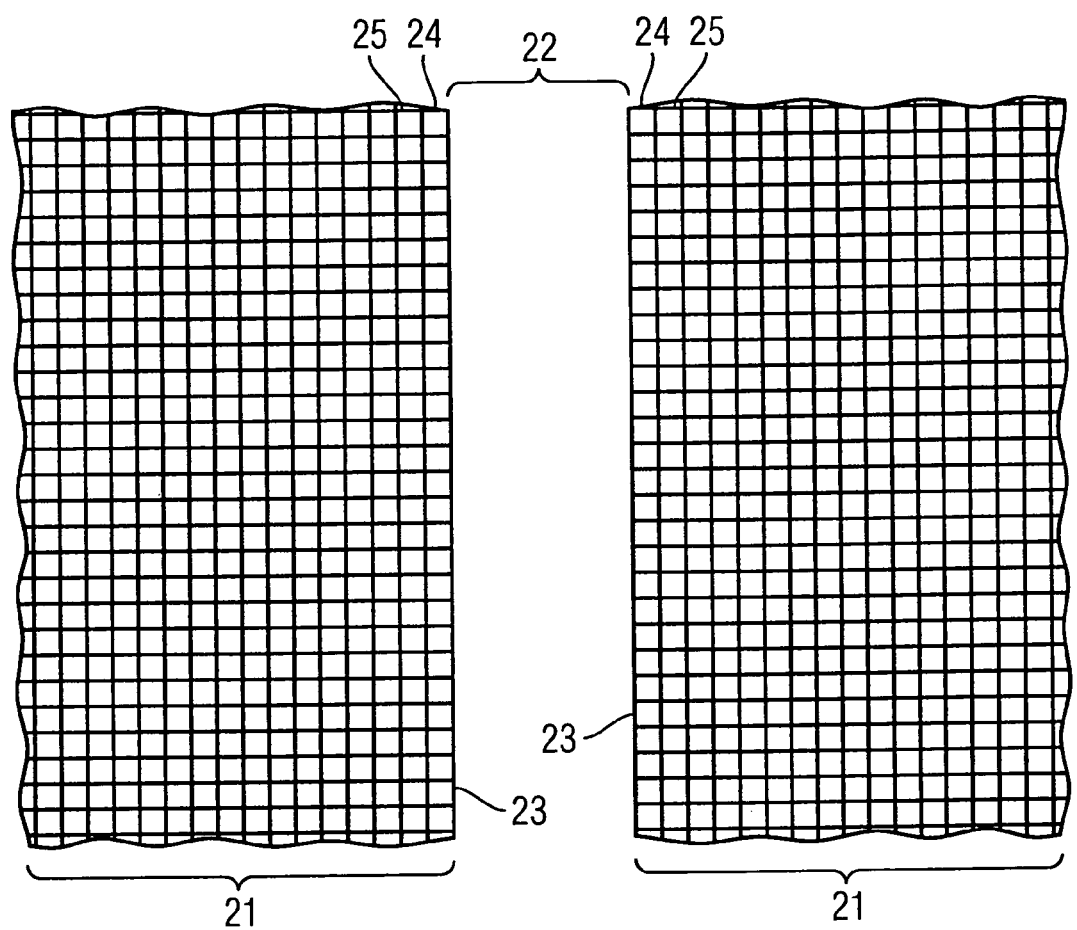
FIG. 3 is a fragmentary, diagrammatic plan view of a substrate for illustrating a fracturing method.

FIG. 3 schematically illustrates a fracturing scheme that can be used for defining an isolated line using the method as illustrated in FIGS. 1A to 1D. For determining the process parameters of the electron beam writer, the exposure region 21 is divided in the shape of a mesh and the energy dose for each of the single boxes forming part of the mesh is determined. In particular, the size of the boxes can vary in the exposure region. For example, in the marginal region 24 and the intermediate region 25, the size of each of the boxes can be 50 to 200 nm, whereas the size of the boxes is larger at a position having a distance of more than 250 nm from the edge 23 of the exposure region. Conventionally, a proximity correction is established. In particular, for assessing the exposure dose for every box, the energy that is deposited due to the exposure of the neighboring boxes is taken into account to obtain a nearly constant amount of energy in each of the boxes of the exposure region.

According to the invention, the exposure dose is determined to have the usual energy deposited in those portions of the exposure region having a distance of more than 250 nm. However, at the margin of the exposure region 21, which is adjacent the edge 23 of the exposure region, the dose is increased to obtain an increased amount of energy deposited in the marginal region 24. In particular, the dose in the marginal region 24 can be increased so that an energy amount of up to $2 \times E_0$ is obtained, wherein $E_0$ denotes the energy deposited in those parts of the exposure region that lie outside the marginal region and the intermediate region. In addition, optionally, in an intermediate region 25 that is adjacent the marginal region 24, the energy deposited can be lowered, for example, down to a value of $0.5 \times E_0$. The size of the marginal region 24, when measured perpendicularly with respect to the edge 23 depends upon the Gaussian distribution of the energy of the electrons, determining the amount of scattering of electrons. Likewise, the width of the intermediate region 25 as well depends upon the Gaussian distribution of the energy of the electrons. The widths of the marginal region 24 and the intermediate region 25 can be chosen to obtain the desired uniformity and resolution as well as the desired target size. In particular, the widths of the marginal region 24 and the intermediate region can be different from each other.

In particular, the scattering of the electrons can be described by a Gaussian distribution that, in turn, depends upon the acceleration voltage, the resist material, and the materials lying beneath the resist layer.

In the following, examples will be given in which an isolated line is defined by performing the method illustrated in FIGS. 1A to 1D. In particular, the isolated line is written by employing an indirect writing method. In the examples, the ratio of the energy in the marginal/intermediate region and the predetermined energy deposition as well as the widths of the marginal and the intermediate regions are varied to obtain a target critical dimension of 100 nm. According to the present invention, the exposure dose is varied to obtain a desired energy deposition in order to define a specific critical dimension of the line to be written.

In other words, the energy deposition and, hence, the exposure doses, depend upon the line width of the portion that has not been exposed. Accordingly, the size of the non-exposure determines the exposure dose; In contrast, according to conventional methods, the exposure doses depend upon the size and density of the other portions of the exposure region.

The following examples are performed with an acceleration voltage of 50 kV, and a base dose of 6.75 μC/cm.

TABLE 1

| Example | Width of marginal region [nm] | Width of intermediate region [nm] | $E_i/E_0$ | $E_m/E_0$ | Offtarget | Uniformity |
|---|---|---|---|---|---|---|
| 1 | 10 | 90 | 0.9 | 1.1 | + | − |
| 2 | 20 | 80 | 0.9 | 1.1 | + | − |
| 3 | 40 | 60 | 0.9 | 1.1 | + | − |
| 4 | 50 | 50 | 0.9 | 1.1 | + | 0 |
| 5 | 10 | 190 | 0.9 | 1.1 | + | − |
| 6 | 20 | 180 | 0.9 | 1.1 | + | − |
| 7 | 30 | 170 | 0.9 | 1.1 | + | 0 |
| 8 | 10 | 290 | 0.9 | 1.1 | + | − |
| 9 | 20 | 280 | 0.9 | 1.1 | + | 0 |
| 10 | 10 | 90 | 2/3 | 4/3 | + | − |
| 11 | 20 | 80 | 2/3 | 4/3 | 0 | − |
| 12 | 30 | 70 | 2/3 | 4/3 | − (~10%) | − |
| 13 | 40 | 60 | 2/3 | 4/3 | − (~10%) | − |
| 14 | 50 | 50 | 2/3 | 4/3 | − (~10%) | 0 |
| 15 | 10 | 290 | 2/3 | 4/3 | 0 | − |
| 16 | 20 | 280 | 2/3 | 4/3 | 0 | + |
| 17 | 30 | 270 | 2/3 | 4/3 | − (~10%) | + |
| 18 | 40 | 260 | 2/3 | 4/3 | − (~10%) | + |
| 19 | 50 | 250 | 2/3 | 4/3 | − (~10%) | + |
| 20 | 10 | 190 | 0.5 | 1.5 | − | − |
| 21 | 20 | 180 | 0.5 | 1.5 | − (>12%) | − |
| 22 | 30 | 170 | 0.5 | 1.5 | − (>12%) | + |
| 23 | 10 | 290 | 0.5 | 1.5 | − (>12%) | 0 |
| 24 | 20 | 280 | 0.5 | 1.5 | − (>12%) | + |
| 25 | 100 | — | — | 1.1 | − | + |
| 26 | 100 | — | — | 4/3 | − | + |
| 27 | 100 | — | — | 1.5 | − | + |

In the above Table 1, the parameter "Offtarget" denotes the deviation of the critical dimension from the target value in %. In particular "+" is given for a deviation of less than 5%, whereas "−" is given for a deviation of at least 10%. Moreover, the parameter "uniformity" compares the normalized gradient of the function of the energy deposited in dependence upon the position with the normalized gradient of the function of the energy of a lines/spaces pattern as is shown in plot "d" of FIG. 2B, for example. The function of the energy of a lines/spaces pattern is regarded as an idealized function and a high degree of conformity of the normalized gradient of the function of the energy with that of a lines/spaces pattern will result in a high uniformity of the pattern defined. Regarding the parameter "Uniformity," "+" is assigned to a ratio of the normalized logarithmic slope of the energy function of an isolated spaces pattern to the normalized logarithmic slope of the energy function of a lines/spaces pattern of greater than 0.9, whereas "−" is assigned to a ratio of the normalized logarithmic slope of the energy function of an isolated spaces pattern to the normalized logarithmic slope of the energy function of a lines/spaces pattern of less than 0.8.

For obtaining optimum results, a compromise between the evaluation of the parameters "Offtarget" and "Uniformity" has to be found.

Figure 4:
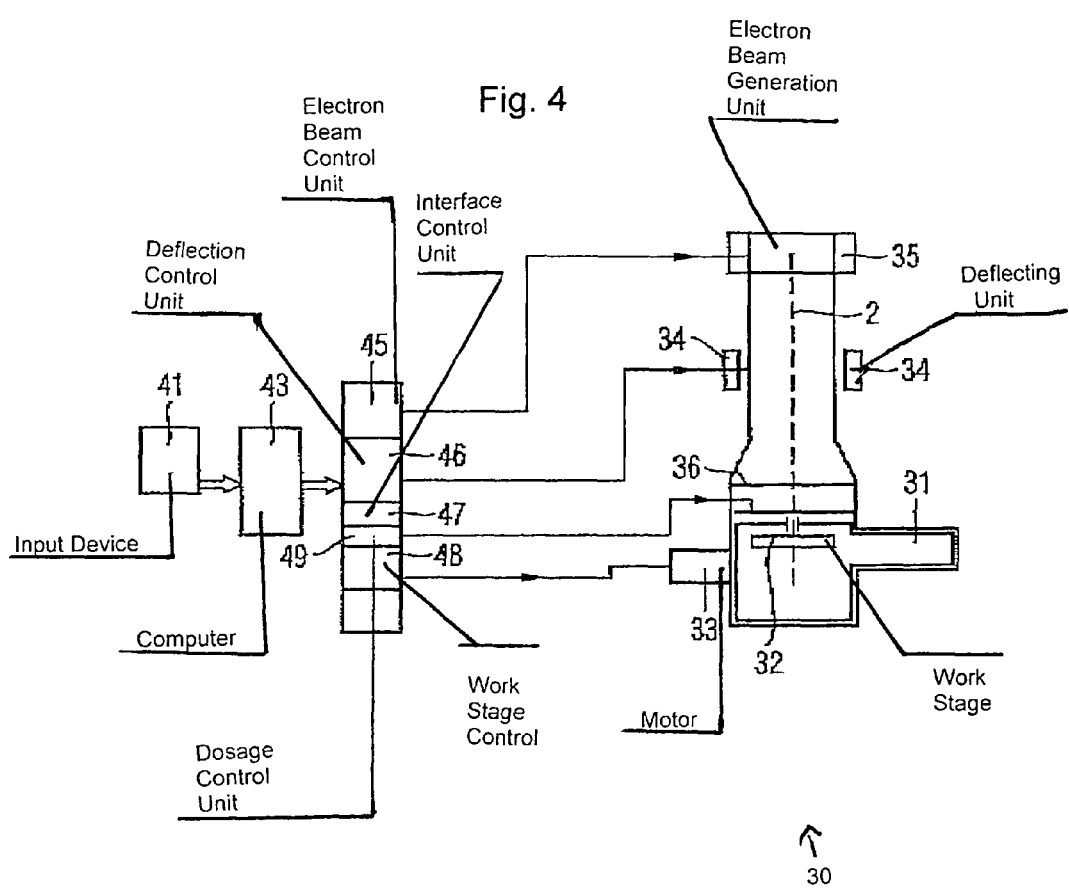
FIG. 4 is a diagrammatic block circuit diagram of an electron beam apparatus according to the invention.

FIG. 4 shows an exemplary electron beam writer 30, to which the method of the present invention can be applied. In particular, the data of the pattern that is to be defined on an arbitrary substrate is input to a computer 43 by a suitable input device 41. A fracturing method for determining the energy dose for each individual pixel is implemented in the computer 43. The computer 43 feeds data to an interface control unit 47, which controls a work stage control 48, which actuates a motor 33 moving a work stage 32 on which a substrate is positioned. Moreover, data submitted by the computer 43 are fed to the deflection control unit 46, which controls the deflecting unit 34 which deflects the electron beam. Moreover, the data provided by the computer 43 are fed to the electron beam control unit 45, which controls the electron beam generation unit 35 in which the electron beam 2 is generated. In particular, the acceleration voltage is controlled by the electron beam control unit 45. The substrate 1 to be patterned is held on the work stage 32 and moved by the motor 33 in accordance with the input from the work stage control 48. Usually, the substrate to be patterned is held under a vacuum in an airlock system 31.

The method for determining the exposure dose for writing a pattern can be implemented in the computer 43 and forms part of the fracturing method.

Alternatively, the method of the present invention can be implemented in the interface control unit 47. In this case, the interface control unit 47 controls a dosage control unit 49 actuating a shutter 36 thus controlling the exposure time and, consequently, the exposure dose of every single pixel.

Although an electron beam writer has been described as an example of a beam writer, it is understood that a general beam writer in which the pattern is written dot-by-dot by exposing the corresponding dot to the beam, having a predetermined energy, lies within the scope of the present invention.

We claim:

1. A method for determining an exposure dose for writing a pattern using a beam writer, in which the pattern is written dot-by-dot by exposing the corresponding dot to the beam having a predetermined energy, which comprises:
   determining an exposure region and a non-exposure region, defining an exposure boundary between the exposure region and the non-exposure region, and defining a marginal region of the exposure region adjacent the exposure boundary;
   determining a target dose in the whole exposure region that obtains a predetermined energy deposition in a specific position of the exposure region, the predetermined energy deposition being larger than a reference energy deposition in the non-exposure region;
   locally increasing the target dose in the marginal region to a value that obtains an energy deposition in the marginal region higher than the predetermined energy deposition; and
   locally decreasing the target dose in an intermediate region of the exposure region, the intermediate region being adjacent to the marginal region, to a value that obtains an energy deposition in the intermediate region smaller than the predetermined energy deposition.

2. The method according to claim 1, which further comprises forming the beam from at least one of particles and photons.

3. The method according to claim 2, which further comprises forming the beam from charged particles.

4. The method according to claim 3, which further comprises selecting the charged particles from at least one of the group consisting of ions and electrons.

5. The method according to claim 1, which further comprises setting a width of the marginal region, measured perpendicularly with respect to the exposure boundary, to be between approximately 1 μm and approximately 1 nm.

6. The method according to claim 5, which further comprises carrying out the width setting step by setting the width of the marginal region to be between approximately 500 nm and approximately 1 nm.

7. The method according to claim 5, which further comprises carrying out the width setting step by setting the width of the marginal region to be between approximately 150 nm and approximately 1 nm.

8. The method according to claim 5, which further comprises carrying out the width setting step by setting the width of the marginal region to be between approximately 25 nm and approximately 1 nm.

9. The method according to claim 8, which further comprises carrying out the width setting step by setting the width of the marginal region to be approximately 1 nm.

10. The method according to claim 1, which further comprises setting a width of the intermediate region, measured perpendicularly with respect to the exposure boundary, to be between approximately 240 nm and approximately 1 nm.

11. The method according to claim 10, which further comprises carrying out the width setting step by setting the width of the intermediate region to be between approximately 100 nm and approximately 1 nm.

12. The method according to claim 10, which further comprises carrying out the width setting step by setting the width of the intermediate region to be between approximately 50 nm and approximately 1 nm.

13. The method according to claim 12, which further comprises carrying out the width setting step by setting the width of the intermediate region to be approximately 1 nm.

14. The method according to claim 1, which further comprises setting an energy deposition according to the relation:

$E_c \leq E_i < E_0$, where $E_i$ is the energy deposition in the intermediate region, $E_c$, is the dose to clear that is necessary to completely develop the resist material exposed by the beam, and $E_0$ is the predetermined energy deposition in those parts of the exposure region that lie outside the marginal region and the intermediate region.

15. The method according to claim 1, which further comprises setting an energy deposition according to the relation:

$E_0 < E_m \leq 10 \times E_0$, where $E_m$ is the energy deposition in the marginal region and $E_0$ is the predetermined energy deposition in those parts of exposure region lying outside the marginal region and the intermediate region.

16. A method for determining an exposure dose for writing a pattern using a beam writer, in which the pattern is written dot-by-dot by exposing the corresponding dot to the beam having predetermined energy, which comprises:
 determining an exposure region and a non-exposure region, defining an exposure boundary between the exposure region and the non-exposure region, and defining a marginal region of the exposure region adjacent the exposure boundary;
 determining a target dose in the exposure region that obtains a predetermined energy deposition in a specific position of the exposure region, the predetermined energy deposition being larger than a reference energy deposition in the non-exposure region;
 locally increasing the target dose in the marginal region to a value that obtains an energy deposition in the marginal region higher than the predetermined energy deposition, wherein an amount of the energy deposition is set in dependence of the size of the non-exposure region.

17. The method according to claim 16, which further comprises locally decreasing the target dose in an intermediate region of the exposure region, the intermediate region being adjacent to the marginal region, to a value that obtains an energy deposition in the intermediate region smaller than the predetermined energy deposition.

18. A method for forming a pattern in a resist material, comprising:
 determining an exposure dose for writing the pattern using a beam writer, which comprises:
  determining an exposure region and a non-exposure region, defining an exposure boundary between the exposure region and the non-exposure region, and defining a marginal region of the exposure region adjacent the exposure boundary;
  determining a target dose in the exposure region that obtains a predetermined energy deposition in a specific position of the exposure region, the predetermined energy deposition being larger than a reference energy deposition in the non-exposure region;
  locally increasing the target dose in the marginal region to a value that obtains an energy deposition in the marginal region higher than the predetermined energy deposition;
  writing the pattern dot-by-dot by exposing the corresponding dot to the beam, applying the determined exposure dose; and
 removing all the portions of the resist layer that have been exposed with the beam.

19. The method according to claim 18, which further comprises locally decreasing the target dose in an intermediate region of the exposure region, the intermediate region being adjacent to the marginal region, to a value that obtains an energy deposition in the intermediate region smaller than the predetermined energy deposition.

20. The method according to claim 18, wherein an amount of the energy deposition is set in dependence of the size of the non-exposure region.

* * * * *